(12) United States Patent
Kunii et al.

(10) Patent No.: US 6,307,245 B1
(45) Date of Patent: Oct. 23, 2001

(54) SEMICONDUCTOR DEVICE

(75) Inventors: Tetsuo Kunii; Naohito Yoshida, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/479,990

(22) Filed: Jan. 10, 2000

(30) Foreign Application Priority Data

Jul. 16, 1999 (JP) .................................................. 11-202881

(51) Int. Cl.[7] .................................................. H01L 27/095
(52) U.S. Cl. .......................... 257/471; 257/473; 438/571
(58) Field of Search .................................... 257/471, 192, 257/193, 194, 201, 631; 438/167, 172, 403, 469, 483, 484

(56) References Cited

U.S. PATENT DOCUMENTS 5,358,885 * 10/1994 Oke et al. ............................ 438/571
6,051,454 * 4/2000 Anda et al. .......................... 438/167

FOREIGN PATENT DOCUMENTS 5218100  8/1993  (JP) .

* cited by examiner

*Primary Examiner*—David Nelms
*Assistant Examiner*—Dung A Le
(74) *Attorney, Agent, or Firm*—Leydig, Voit & Mayer, Ltd.

(57) ABSTRACT

A method of producing a semiconductor device includes a semiconductor substrate and a gate embedding layer. A pair of side walls made of insulating layers having a width are formed on the inner surface of a first opening and the gate embedding layer is formed by using the pair of side walls and a first insulating layer as masks so that the embedded portion and the first extending portion are self-aligned and, consequently, the first extending portion is symmetrical with respect to the embedded portion. Accordingly, the first extending portion of the gate electrode is offset toward the drain electrode or source electrode.

3 Claims, 7 Drawing Sheets

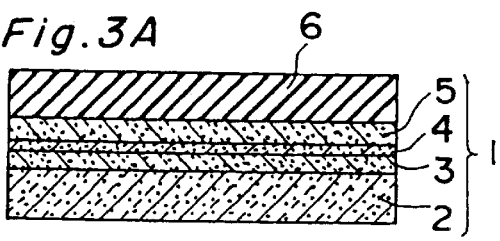
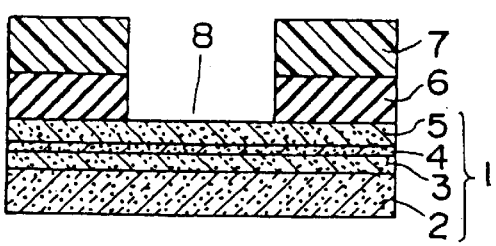
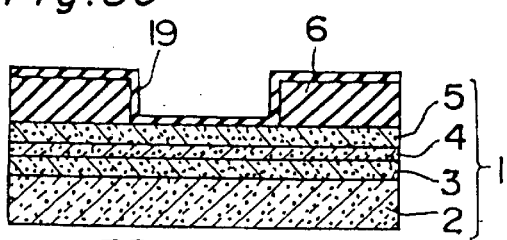
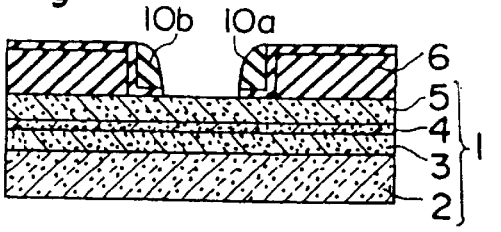
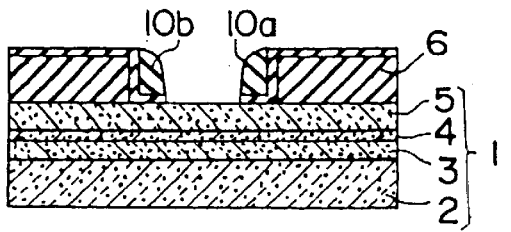
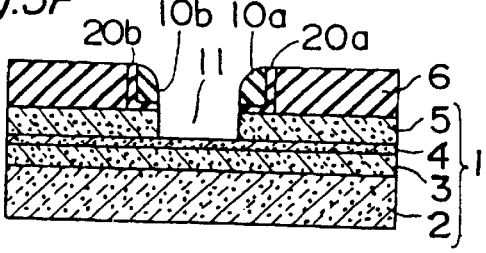
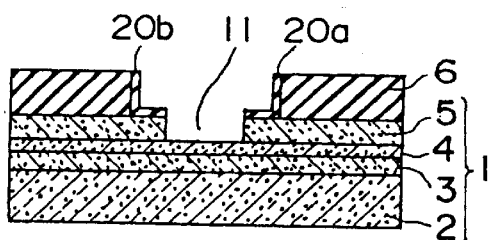
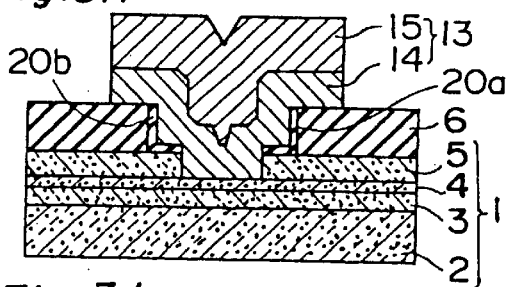
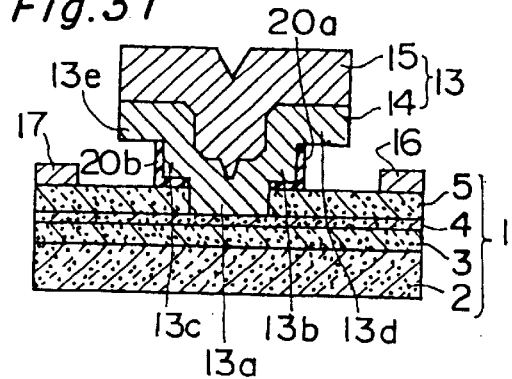

US 6,307,245 B1

SEMICONDUCTOR DEVICE

BACKGROUND OF THE INVENTION

1. Field of the Invention

The present invention relates to a semiconductor device having a gate embedding layer on the surface of a semiconductor substrate reducing the effective gate length and reducing the drain conductance ($g_{ad}$), and a method of producing the same.

2. Description of the Related Art

It is necessary to decrease the capacitance between a gate and a source in order to improve the high-frequency characteristics of a semiconductor device, particularly to achieve a high gain, and one of effective means for this purpose is to reduce the gate length. For this reason, a semiconductor device disclosed in Japanese Laid-Open Patent Publication No.5-218100 using a T-shaped gate electrode has been suggested. However, reducing the gate length leads to an increase in the drain conductance, that in a high-output power device, in particular, may lower the efficiency. Accordingly, the conventional T-shaped gate electrode has been insufficient to reduce the drain conductance.

With this background, semiconductor devices comprising a gate electrode that has a gate embedding layer and extending portions have been studied. FIG. 6 is a longitudinal sectional view of a semiconductor device showing an example. Reference numeral 30 denotes a semiconductor substrate that consists of a semi-insulating GaAs substrate 31, an n-GaAs active layer 32, a gate embedding layer 33 comprising an n-GaAs layer and a n$^+$-GaAs layer 34. Numeral 37 denotes a drain electrode made of an AuGe-based metal, 38 denotes a source electrode made of an AuGe-based metal, 40 denotes a gate electrode made of an Al-based metal, 40a denotes an embedded portion of the source electrode 40, and 40b, 40c denote extending portions of the gate electrode 40 that is joined with the gate embedding layer 33. The extending portions 40b, 40c extend laterally outwardly in opposite directions.

As shown in FIG. 6, it is made possible to reduce the effective gate length by embedding a central portion of the bottom of the gate electrode in the gate embedding layer 33 and reducing the width of the embedded portion 40a that is nearest to a channel. Also because the extending portions 40b, 40c on both sides (drain electrode and source electrode) of the embedded portion 40a are joined with the gate embedding layer 33, drain conductance can be reduced particularly when the value of drain voltage (VD) is increased, compared to a structure without extending portions on both sides.

FIGS. 7A–7D show a schematic flow sheet showing a conventional method of producing the semiconductor device shown in FIG. 6. As shown in FIG. 7A, a dummy gate electrode 35 made of photoresist applied to form the embedded portion 40a is formed on the n$^+$-GaAs layer 34 in first photolithography step. This is followed by the deposition of an insulation layer 36 made of SiO$_2$ of a predetermined thickness, on the dummy gate electrode 35 and the n$^+$-GaAs layer 34, as shown in FIG. 7B. Then as shown in FIG. 7C, the n$^+$-GaAs layer 34 is etched through till the gate embedding layer 33 is exposed, thereby to form an opening in the n$^+$-GaAs layer 34. Formed thereafter are the drain electrode 37, the source electrode 38, and photoresist 39 applied to form the extending portions 40b, 40c in second photolithography step. Then as shown in FIG. 7D, etching is done so as to penetrate through the gate embedding layer 33 and increase the width of the opening. Thus a metal layer to form the gate electrode is deposited, and the gate electrode 40 having the embedded portion 40a and the extending portions 40b, 40c is formed, as shown in FIG. 7E.

In the conventional method, however, the embedded portion 40a and the extending portions 40b, 40c of the gate electrode 40 are formed in separate photolithography steps, and therefore misalignment during the photolithography step causes the extending portions 40b, 40c to be formed unsymmetrically with respect to the embedded portion 40a.

In a high output power device, as it ordinarily employs a multi-finger pattern for power output, in case the extending portions 40b, 40c are formed unsymmetrically with respect to the embedded portion 40a, there has been such a problem that fingers that are offset toward the drain electrode and fingers that are offset toward the source electrode are formed alternately, thus making causes for uneven operation or lower performance.

SUMMARY OF THE INVENTION

Thus, an object of the present invention is to provide a method of producing a semiconductor device where the extending portion of the gate electrode will never be formed at a position shifted toward the drain electrode or the source electrode, and a high-performance semiconductor device obtained by the method.

To solve the above problems, the method of producing a semiconductor device comprising a semiconductor substrate that has a gate embedding layer, a gate electrode, a source electrode and a drain electrode that are disposed to interpose the gate electrode according to the present invention comprises the steps of: (a) forming a first insulation layer of a predetermined thickness on the surface of the gate embedding layer; (b) etching through the first insulation layer to form a first opening through which the gate embedding layer is exposed; (c) forming a second insulation layer on the top surface of the semiconductor substrate that includes the first opening; (d) etching the second insulation layer to expose the central portion of the gate embedding layer in the first opening and forming a pair of side walls having a predetermined width of the second insulation layer on the inner surface of the first opening; (e) forming a second opening having width smaller than that of the first opening in the gate embedding layer below the first opening by etching with the pair of side walls and the first insulation layer being used as masks; (f) removing at least one of the pair of side walls thereby to form a step that includes the top surface of the gate embedding layer around the second opening; (g) depositing a he gate electrode forming metal layer in the first opening and the second opening; (h) removing the first insulation layer to form a gate electrode; and (i) forming the drain electrode and the source electrode, wherein the gate electrode has an embedded portion embedded in the gate embedding layer, two first extending portions joined with the step surface and two second extending portions formed on the associated first insulating layers so that lower surfaces of the two second extending portions are located at a level, above the step surfaces, equal to a height of the first insulating layers.

According to the present invention, as the pair of side walls having the predetermined width comprising insulation layers are formed on the inner surface of the first opening and the gate embedding layer is formed by using the pair of side walls and the first insulation layer as the masks, the second opening that becomes the embedded portion is formed while being separated from both inner surfaces of the first opening inward by the widths of the side walls. As a consequence, the embedded portion and the first extending portion are formed in a self-aligning way in accordance to the positions and widths of the second opening and the first opening, so as the first extending portions not to be formed unsymmetrically with respect to the embedded portion.

It is preferable to remove one, located on the drain electrode side, of the pair of side walls in the step of forming the step surface, and to remove the other side wall remaining on the source electrode side in the step of forming the gate electrode, thereby to form the first extending portion on the drain electrode side. Thus, the source resistance can be reduced because there is not the first extending portion on the source electrode side.

It is also preferable to provide a step of forming a third insulation layer over the entire surface of the first insulation layer for the protection of the first insulation layer, between the step of forming the first insulation layer and the step of forming the first opening, and to remove the third insulation layer in the step of forming the step surface. Since the first insulation layer can be prevented from being etched when the side walls are formed, thickness of the first insulation layer can be maintained at a specified value. As a result, height of the second extending portion above the gate embedding layer can be maintained at a specified value, thus making it possible to stabilize the shape of the gate electrode and reduce the parasitic capacitance.

It is preferable to provide, after forming the first opening, a step of forming a conductive protection layer that protects the first insulation layer on the top surface of the semiconductor including the first opening, and to carry out the etching in the step of forming a step surface so that the conductive protection layer contacting with the step surface and the conductive protection layer contacting with the side face of the first insulation layer which is in continuity with the step surface are left without being etched. Since the inner surface of the first insulation layer can be prevented from being etched when the side walls are removed, widening of the first opening can be suppressed.

The semiconductor device according to the present invention comprises an active layer on the semi-insulating substrate surface, a semiconductor substrate formed by laying Schottky layer and gate embedding layer alternately, a gate electrode, a source electrode and a drain electrode that are disposed to interpose the gate electrode, wherein the gate electrode has an embedded portion that is joined with the Schottky layer and embedded in the gate embedding layer, a first extending portion that are provided on the drain electrode side in continuity with the embedded portion and joined with the gate embedding layer and a pair of second extending portions formed on the gate embedding layer so that lower surfaces of the two second extending portions are located at a predetermined level, above a surface of gate embedding layer with one of the pair being in continuity with the first extending portion.

Another semiconductor device according to the present invention comprises a semiconductor substrate that has an active layer, a Schottky layer and a gate embedding layer on a semi-insulating substrate surface, a gate electrode, a source electrode and a drain electrode that are disposed to interpose the gate electrode, wherein the gate electrode has an embedded portion that is joined with the Schottky layer and embedded in the gate embedding layer, two first extending portions that are in continuity with the embedded portion, a conductive protection layer that is provided around the first extending portions, joined with the gate embedding layer and defines the predetermined width of the first extending portion, and two second extending portions formed on the associated first insulating layers so that lower surfaces of the two second extending portions are located at a predetermined level, above a surface of gate embedding layer.

BRIEF DESCRIPTION OF THE DRAWINGS

The above and other objects and features of the present invention will become more apparent from the following description of preferred embodiments thereof with reference to the accompanying drawings, throughout which like parts are designated by like reference numerals.

FIGS. 3A–3I show schematic longitudinal sectional views in a flow sheet of a method of producing a semiconductor device according to the third embodiment of the present invention.

DESCRIPTION OF THE PREFERRED EMBODIMENTS

This application is based on application No.11-202881 filed Jul. 16, 1999 in Japan, the content of which is incorporated hereinto by reference.

Preferred embodiments of the method of producing the semiconductor according to the present invention will now be described below with reference to the accompanying drawings.

Embodiment 1

Figure 1A:
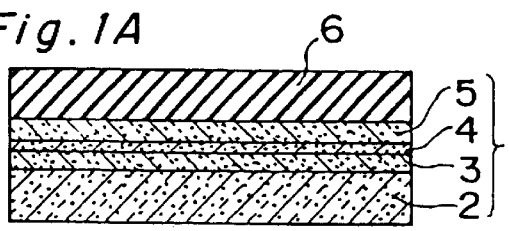
FIGS. 1A–1H show schematic longitudinal sectional views in a flow sheet of a method of producing a semiconductor device according to the first embodiment of the present invention.
Figure 1F:
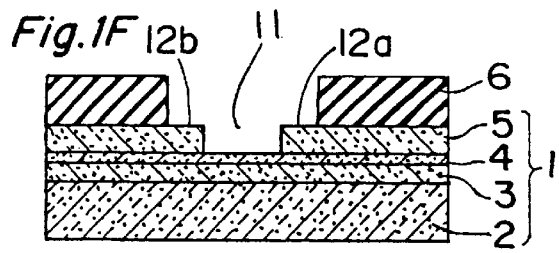
Figure 1B:
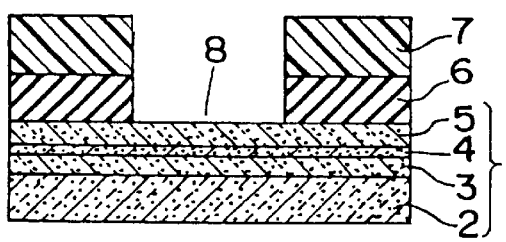
Figure 1G:
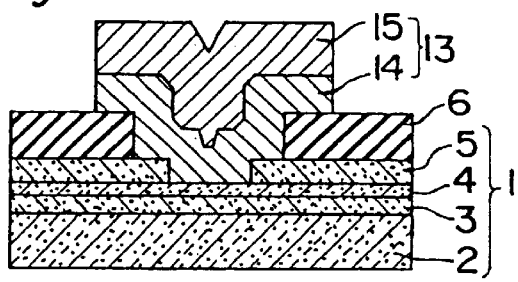
Figure 1C:
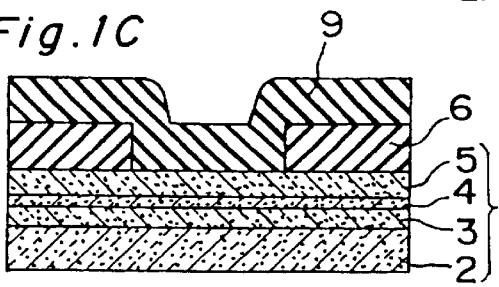
Figure 1H:
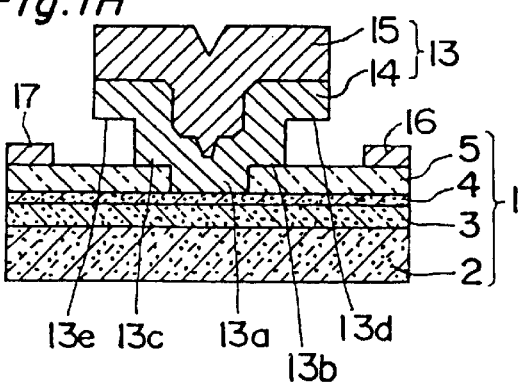
Figure 1D:
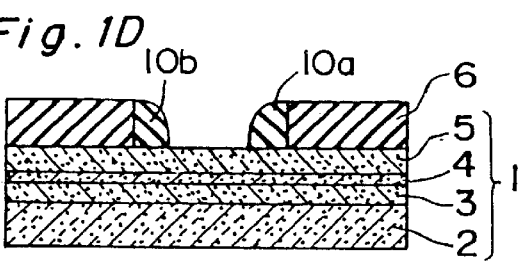

FIGS. 1A–1H are schematic sectional views showing a flow sheet of the first embodiment. Reference numeral 1 denotes a semiconductor substrate comprising a semi-insulating substrate 2 made of semi-insulating GaAs, an active layer 3 made of n-GaAs, a Schottky layer 4 made of n-AlGaAs and a gate embedding layer 5 made of n-GaAs. As shown in FIG. 1A, a first insulation layer 6 made of $Si_3N_4$ is deposited over the entire surface of the semiconductor substrate 1 to a thickness of about 4000 Å. Then as shown in FIG. 1B, a first opening 8 of about 1 μm is formed by dry etching of the first insulation layer 6 using a photoresist 7. Then a second insulation layer 9 made of $SiO_2$ is deposited to a thickness of about 4000 Å (FIG. 1C). A pair of side walls 10a, 10b of the second insulation layer 9 are formed on the inner surface of the first insulation layer 6 through anisotropic etching of the second insulation layer 9 by reactive ion etching (FIG. 1D).

Figure 1E:
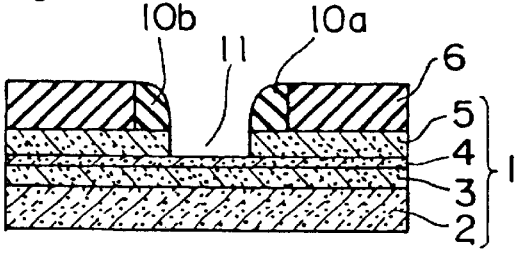

The side walls 10a, 10b and the first insulation layer 6 are used as masks to selectively remove only the gate embedding layer 5 by dry etching, thereby to form a second opening 11 wherein the Schottky layer 4 is exposed (FIG. 1E). This is followed by selective removal of only the side walls 10a, 10b by hydrofluoric acid solution thereby to expose steps 12a, 12b in the second opening 11 as shown in FIG. 1F, taking advantage of the fact that the etching rate of the second insulation layer 8 made of $SiO_2$ film with the hydrofluoric acid solution is far greater than that of the first insulation layer 6 made of $Si_3N_4$. Then a WSi film 14 and an Au film 15 are deposited over the entire surface of the semiconductor substrate by sputtering, and unnecessary portions are removed by ion milling and dry etching, thereby to form a gate electrode 13 made of the WSi film 14 and the Au film 15 (FIG. 1G). After removing the first insulation layer 6 with the hydrofluoric acid solution, a drain electrode 16 and a source electrode 17 made of an AuGe-based metal are formed (FIG. 1I). Through these steps, the semiconductor device comprising the gate electrode 13 that has the embedded portion 13a part of which is embedded in the gate embedding layer 5, the first extending portions 13b, 13c joined with the step surfaces 12a, 12b and the second extending portions 13d, 13e formed on the associated first insulating layers 6 so that lower surfaces of the two second extending portions 13d, 13e are located at a level, above the step surfaces 12a, 12b equal to a height of the first insulation layer 6.

According to the first embodiment, the width of the second opening 11 can be freely set in a range from 0.1 $\mu$m to 1 $\mu$m by changing the thickness of the second insulation layer 8, while the first opening 8 and the second opening 11 are formed symmetrically since the second opening 11 is formed in self-aligning way with respect to the first opening 8. As a consequence, the embedded portion and the first extending portion are formed in self-aligning way and the first extending portions will be formed symmetrically with respect to the embedded portion. Also because it suffices to employ photolithography only when forming the first opening 8, photolithography steps can be reduced compared to the conventional method.

Embodiment 2

Figure 2A:
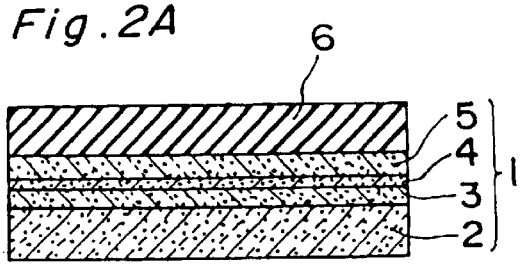
FIGS. 2A–2I show schematic longitudinal sectional views in a flow sheet of a method of producing a semiconductor device according to the second embodiment of the present invention.
Figure 2B:
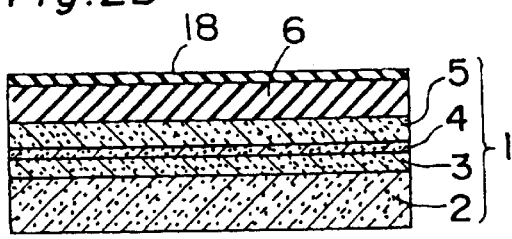
Figure 2C:
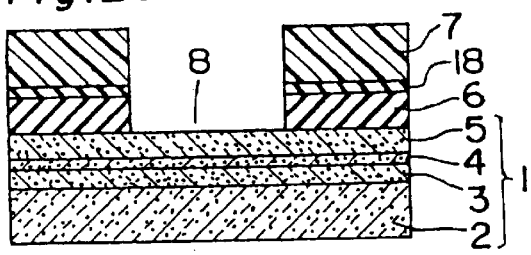
Figure 2D:
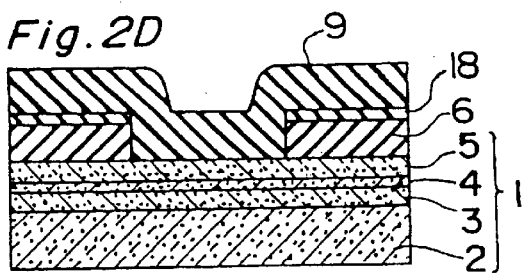
Figure 2E:
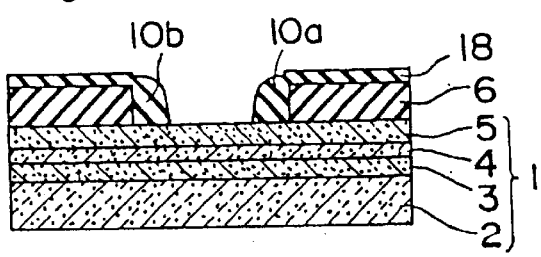
Figure 2F:
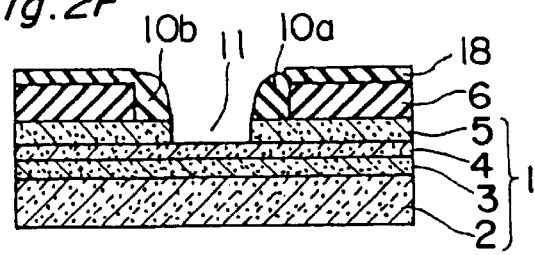
Figure 2G:
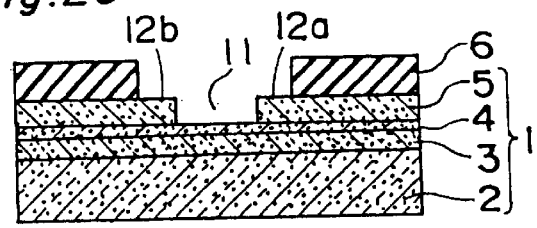
Figure 2H:
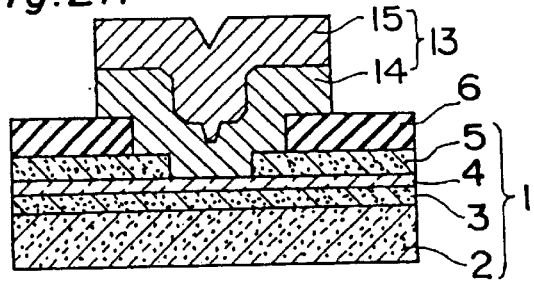
Figure 2I:
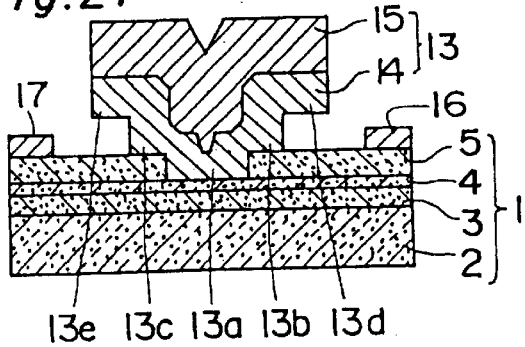

FIGS. 2A–2I are schematic sectional views showing a flow sheet of the second embodiment. In this embodiment, the semiconductor device can be produced by a method similar to the first embodiment, except that a third insulation layer 18 made of $SiO_2$ is formed on the first insulation layer 6 to a thickness of about 1000 Å (FIG. 2B), and the third insulation layer 18 formed on the first insulation layer 6 is removed at the same time when the side walls 10a, 10b are removed (FIG. 2G).

During anisotropic dry etching of the $SiO_2$ film of the second insulation layer 9 to form the side walls 10a, 10b, the $Si_3N_4$ film of the first insulation layer 6 that is exposed at the same time tends to be etched more, since the $Si_3N_4$ film has higher etching rate than the $SiO_2$ film to dry etching. As a result, there are such problems as height of the second extending portions 13d, 13e of the gate electrode 13 of the semiconductor device that is produced does not remain constant and the shape tends to be unstable, while there is a possibility that a constant capacitance between the gate and the drain cannot be obtained. According to the second embodiment, however, exposure of the $Si_3N_4$ film can be restrained during the anisotropic etching of the $SiO_2$ film, because there is the third insulation layer 18 made of $SiO_2$ film on the $Si_3N_4$ film of the first insulation layer 6 for the protection of the first insulation layer 6. Therefore, it is made possible to control the second extending portions 13d, 13e of the gate electrode 13 to a predetermined value.

While the third insulation layer may be made of any known material that has an etching rate to dry etching lower than that of the $Si_3N_4$ film, $SiO_2$ film is preferable.

Embodiment 3

FIGS. 3A–3I are schematic sectional views showing a flow sheet of the third embodiment. In this embodiment, the semiconductor device can be produced by a method similar to the first embodiment, except that a conductive protection layer 19 made of WSi film is formed to a thickness of about 500 Å by sputtering after forming the first opening 8 (FIG. 3C), only the side walls 10a, 10b are selectively removed with hydrofluoric acid solution and remaining conductive protection layers 20a, 20b are formed while leaving the conductive protection layer 19 to remain only around the first extending portions 13b, 13c of the gate electrode 13 (FIG. 3G).

In the semiconductor device obtained in accordance to the third embodiment, as shown in FIG. 3I, the gate electrode 13 has an embedded portion 13a, a part of the bottom of which is joined with the Schottky layer 4 and is embedded in the gate embedding layer 5, two first extending portions 13b, 13c that are in continuity with the embedded portion 13a, the remaining conductive protection layers 20a, 20b that are provided around the first extending portions 13b, 13c and define the first extending portions 13b, 13c, and a pair of second extending portions 13d, 13e that are in continuity with the first extending portions 13b, 13c. The first extending portions 13b, 13c are joined with the gate embedding layer 5 via the remaining conductive protection layers 20a, 20b, and the second extending portions 13d, 13e are disposed at a predetermined level, above a surface of the gate embedding layer 5, equal to a height of the first insulation layers 6.

According to the third embodiment, because etching of the first insulation layer 6 made of $Si_3N_4$ can be restrained by using the hydrofluoric acid solution that has a very low etching rate on WSi compared to that on $Si_3N_4$ film, when selectively removing the side walls 10a, 10b with the hydrofluoric acid solution, width of the first opening 8 will not vary. Therefore, it is made possible to control the width of the first extending portions 13b, 13c of the gate electrode 13 always to a predetermined value.

While the WSi film is used for the conductive protection layer in the third embodiment, any known metal can be used as long as the metal is capable of forming Schottky junction with the gate embedding layer.

Embodiment 4

Figure 4A:
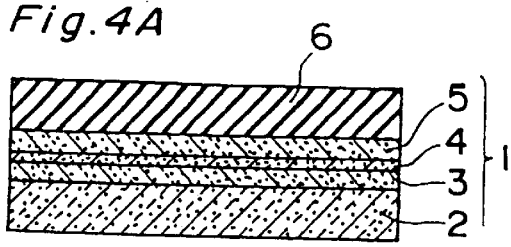
FIGS. 4A–4H show schematic longitudinal sectional views in a flow sheet of a method of producing a semiconductor device according to the fourth embodiment of the present invention.
Figure 4B:
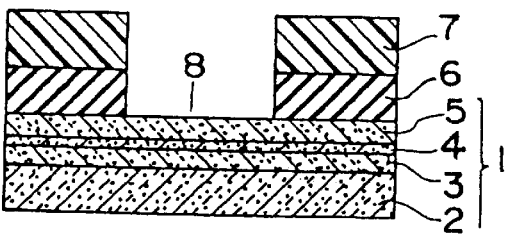
Figure 4C:
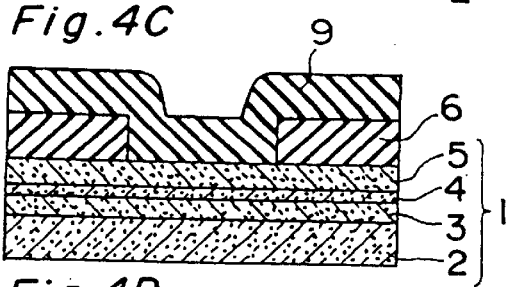
Figure 4D:
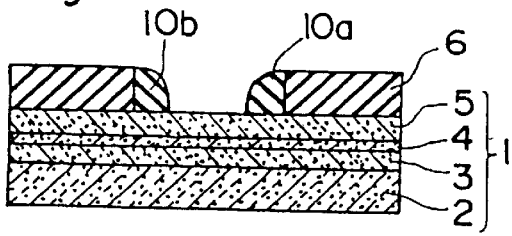
Figure 4E:
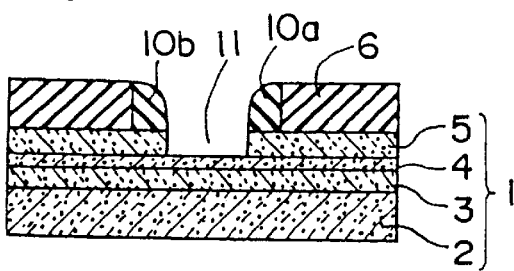
Figure 4F:
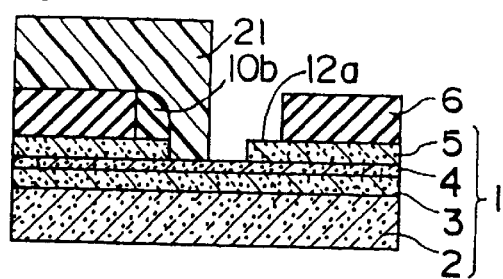
Figure 4G:
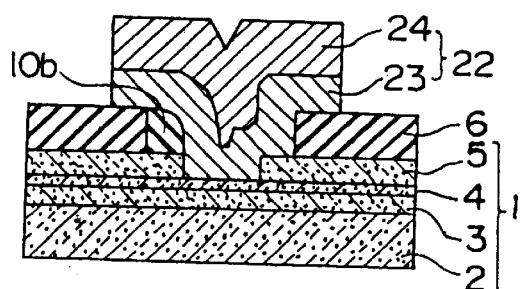
Figure 4H:
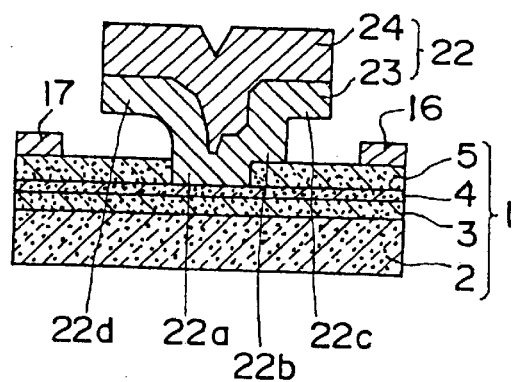

FIGS. 4A–4H are schematic sectional views showing a flow sheet of the fourth embodiment. In this embodiment, the semiconductor device can be produced by a method similar to the first embodiment, except that the side wall 10b on the source electrode 17 side is masked with a photoresist 21 after forming the second opening 11 to selectively remove only the side wall 10a on the drain electrode 16 side with the hydrofluoric acid solution (FIG. 4F), and the side wall 10b is removed when removing the first insulation layer 6 (FIG. 4H).

In the semiconductor device obtained in accordance to the fourth embodiment, as shown in FIG. 4H, a gate electrode 22 has an embedded portion 22a, a part of the bottom of which is joined with the Schottky layer 4 and is embedded in the gate embedding layer 5, a first extending portion 22b that is in continuity with the embedded portion 22a, and a pair of second extending portions 22c, 22d, one of which is in continuity with the first extending portion 22b. The first extending portion 22b is provided on the drain electrode 16 side of the embedded portion 22a, and is joined with the gate embedding layer 5 while the pair of second extending portions 22c, 22d are disposed at a level, above a surface of the gate embedding layer 5, equal to a height of the first insulation layers 5.

According to the fourth embodiment, since such a gate electrode can be made that has the first extending portion 22b only on the drain electrode 16 side without first extending portion on the source electrode 17 side, source resistance can be reduced.

Figure 5:
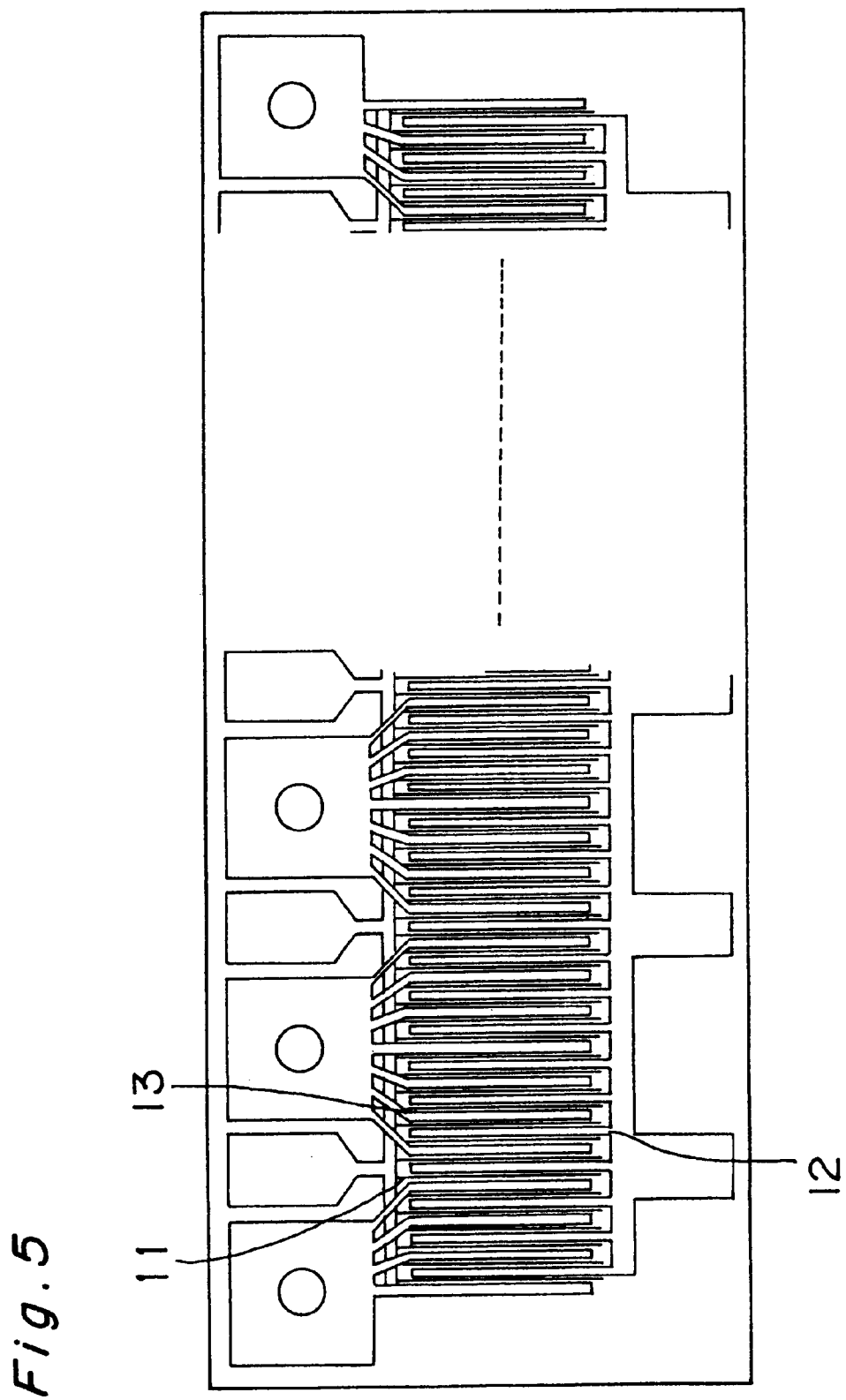
FIG. 5 is a schematic plan view showing the overall configuration of the semiconductor device produced by the method of the present invention.
Figure 6:
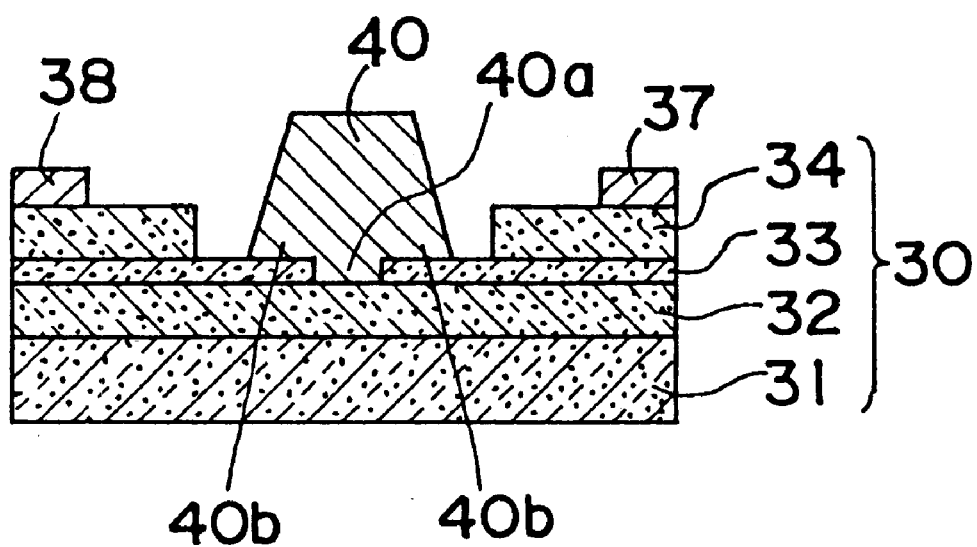
FIG. 6 is a schematic longitudinal sectional view showing the configuration of a conventional semiconductor device.
Figure 7A:
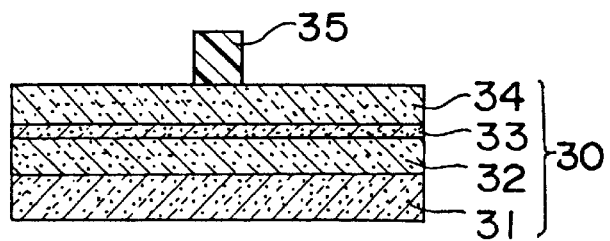
FIGS. 7A–7E show schematic longitudinal sectional views showing a flow sheet of a method of producing a conventional semiconductor device.
Figure 7B:
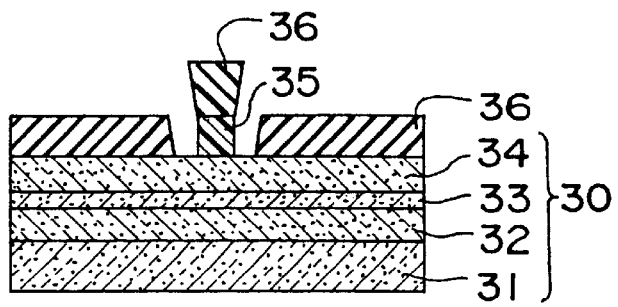
Figure 7C:
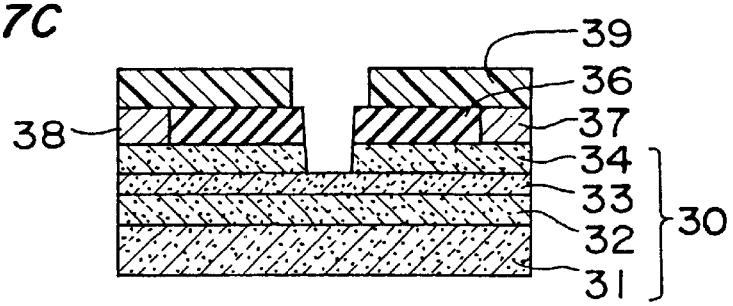
Figure 7D:
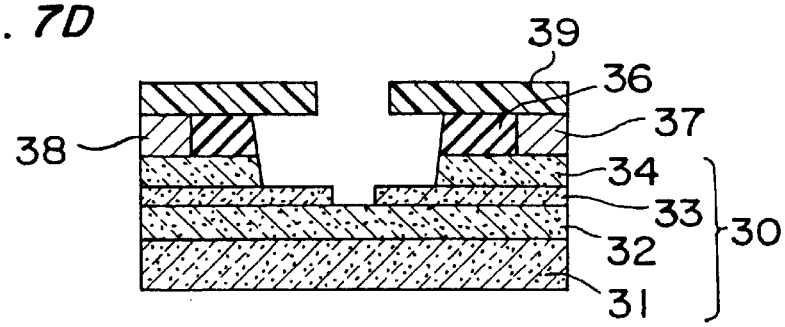
Figure 7E:
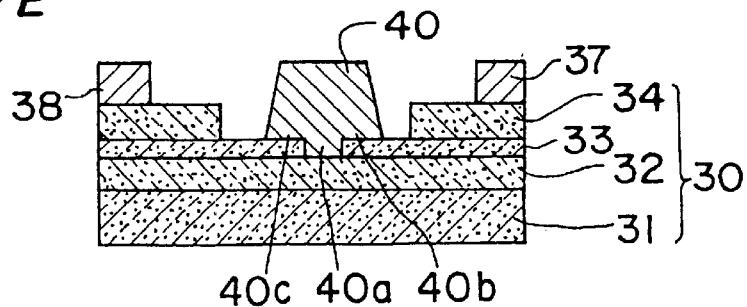

FIG. 5 is a schematic plan views showing the overall configuration (finger pattern) of the semiconductor device produced by the apparatus of the present invention. Such a finger pattern can be formed as the drain electrode 16 and source electrode 17 are disposed symmetrically with respect to the gate electrode 13.

Constructed as above described the present invention exhibits the following effects.

Since the pair of side walls made of insulation layers having a predetermined width are formed on the inner surface of the first opening and the gate embedding layer is formed by using the pair of side walls and the first insulation layer as the masks so that the embedded portion and the first extending portions are formed in self-aligning way, the first extending portions will be formed symmetrically with respect to the embedded portion. As a consequence, the method of producing the high performance semiconductor device free from uneven operation can be provided. Also because the photolithography steps can be reduced compared to the prior art, production cost can be reduced.

Since not only the embedded portion and the first extending portion can be formed in self-aligning way, but also the gate electrode that has the first extending portion only on the drain electrode side can be made by masking one of the pair of side walls, the method capable of reducing the source resistance can be provided.

Since the thickness of the first insulation layer can be maintained at a predetermined value when forming the side walls by providing the third insulation layer as a protective layer on the surface of the first insulation layer, such a method can be provided as not only the embedded portion and the first extending portion can be formed in self-aligning way, but also the shape of the gate electrode can be stabilized and the parasitic capacitance can be reduced.

Since the inner surface of the first insulation layer can be prevented from being etched when removing the side wall by forming the conductive protection layer for the protection of the first insulation layer, widening of the first opening can be suppressed. As a consequence, such a method can be provided that is capable of forming the embedded portion and the first extending portion in self-aligning way with higher accuracy.

Since the gate electrode has the embedded portion, the first extending portion provided on the drain electrode side and joined with the gate embedding layer, and the second extending portions located at a predetermined height level, above the surface of the embedded portion, such a semiconductor device that has less variation in the shape of the gate electrode, less parasitic capacitance and lower source resistance can be provided.

Furthermore, such a semiconductor device can be provided that has the conductive protection layer left to remain around the first extending portion, with less variation in the width of the step surface while the embedded portion and the first extending portion are formed in self-aligning way with higher accuracy.

Although the present invention has been fully described by way of examples with reference to the accompanying drawings, it is to be noted here that various changes and modifications will be apparent to those skilled in the art.

Therefore, unless such changes and modifications otherwise depart from the spirit and scope of the present invention, they should be construed as being included therein.

What is claimed is:

1. A semiconductor device comprising:
    a semi-insulating substrate;
    an active layer on the semi-insulating substrate;
    a semiconductor substrate including a Schottky layer and a semiconductor gate embedding layer, disposed on the semi-insulating substrate, the gate embedding layer having side surfaces transverse to the semi-insulating substrate and a top surface parallel to the semi-insulating substrate;
    a gate electrode; and
    a source electrode and a drain electrode disposed on opposite sides of the gate electrode, the gate electrode comprising:
        an embedded portion contacting the Schottky layer and embedded in and contacting the side surfaces of the gate embedding layer;
        two first extending portions contiguous with the embedded portion and contacting the top surface of the gate embedding layer; and
        a pair of second extending portions contiguous with the first extending portions and opposite the gate embedding layer so that lower surfaces of the second extending portions are spaced from the top surface of the gate embedding layer.

2. A semiconductor device comprising:
    a semi-insulating substrate;
    an active layer on the semi-insulating substrate;
    a semiconductor substrate including a Schottky layer and a semiconductor gate embedding layer, disposed on the semi-insulating substrate, the gate embedding layer having side surfaces transverse to the semi-insulating substrate and a top surface parallel to the semi-insulating substrate;
    a gate electrode; and
    a source electrode and a drain electrode disposed on opposite sides of the gate electrode, the gate electrode comprising:
        an embedded portion contacting the Schottky layer and embedded in and contacting the side surfaces of the gate embedding layer;
        two first extending portions contiguous with the embedded portion;
        a conductive protection layer located at and contacting the first extending portions at opposite sides of the first extending portions, and contacting and sandwiched between the first extending portions and the top surface of the gate embedding layer; and
        two second extending portions contiguous with the first extending portions and spaced from the top surface of the gate embedding layer.

3. A semiconductor device comprising:

a semi-insulating substrate;

an active layer on the semi-insulating substrate;

a semiconductor substrate including a Schottky layer and a semiconductor gate embedding layer, disposed on the semi-insulating substrate, the gate embedding layer having side surfaces transverse to the semi-insulating substrate and a top surface parallel to the semi-insulating substrate;

a gate electrode; and a source electrode and a drain electrode disposed on opposite sides of the gate electrode, the gate electrode comprising:

an embedded portion contacting the Schottky layer and embedded in and contacting the side surfaces of the gate embedding layer;

two first extending portions contiguous with the embedded portion, only one of the two first extending portions contacting the top surface of the gate embedding layer; and a pair of second extending portions contiguous with the first extending portions and opposite the gate embedding layer so that lower surfaces of the second extending portions are spaced from the top surface of the gate embedding layer.

* * * * *